United States Patent [19]
Appold

[11] Patent Number: 5,159,266
[45] Date of Patent: Oct. 27, 1992

[54] TEST SOCKET AND METHOD FOR FAILURE ANALYSIS OF PLASTIC QUAD FLAT PACK DEVICES

[75] Inventor: Brian M. Appold, Fremont, Calif.

[73] Assignee: VLSI Technology, Inc., San Jose, Calif.

[21] Appl. No.: 738,655

[22] Filed: Jul. 31, 1991

[51] Int. Cl.$^5$ ............... G01R 1/06; H01R 13/629
[52] U.S. Cl. ............... 324/158 F; 324/158 P; 437/8; 439/70
[58] Field of Search ............... 324/72.5, 158 F, 158 P; 439/68, 69, 269, 70, 266, 71, 259, 264; 361/403; 29/857

[56] References Cited

U.S. PATENT DOCUMENTS

| | | | |
|---|---|---|---|
| Re. 28,064 | 7/1974 | Venaleck et al. | 439/269 |
| 4,574,235 | 3/1986 | Kelly et al. | 324/158 F |
| 4,749,362 | 6/1988 | Hoffman et al. | 439/269 |
| 4,768,972 | 9/1988 | Ignasiak et al. | 439/70 |
| 4,835,469 | 5/1989 | Jones et al. | 324/158 P |
| 5,105,149 | 4/1992 | Tokura | 324/158 R |

*Primary Examiner*—Vinh Nguyen
*Attorney, Agent, or Firm*—Hickman & King

[57] ABSTRACT

A test socket and a method is provided for mounting and testing a quad flat pack QFP integrated-circuit package, where the QFP package has its leads cut to extend a predetermined distance from the sidewalls of the QFP integrated circuit package. The test socket includes a base to which are mounted a number of resilient contact blades having contacts for contacting the cut leads of the QFP device. A number of tester connection pins are mounted in the base and are connected to the contact blades. A movable comb member spaces the contact blades apart and is adjustably positioned to urge the contact blades into contact with the cut leads of a QFP device.

10 Claims, 4 Drawing Sheets

TEST SOCKET AND METHOD FOR FAILURE ANALYSIS OF PLASTIC QUAD FLAT PACK DEVICES

BACKGROUND OF THE INVENTION

1. Field of the Invention

This invention relates to apparatus and methods for testing packaged integrated circuits and, more particularly, to test sockets and methods for failure analysis of quad flat pack QFP integrated circuit devices.

2. Prior Art

Integrated circuits are commonly packaged in a package configuration referred to as a quad flat pack QFP package. In this type of package, the leads are very thin, flat metal conductors which extend outwardly from the four side walls of the flat rectangular package. Inoperative quad flat pack devices are frequently returned by customers to the manufacturer as allegedly defective parts for further testing and failure analysis by the manufacturer. These returned QFP devices are often returned with damaged leads because the customers have performed incoming inspection and in-situ testing of these devices with the devices having been mounted to the actual circuit boards of a system. For customer testing, the individual integrated-circuit devices are soldered to a circuit board and the entire circuit board is tested by the customer. When a particular integrated-circuit device is suspected of being detective, that device is removed from the circuit board by de-soldering. During this de-soldering step, the leads of the device are often severely damaged. This kind of damage to the leads often prevents the integrated-circuit device from being tested on the manufacturer's automatic testing machines to verify that the device itself was defective, rather than damaged or misused by the customer. Customers return defective devices to the manufacturers and request credit, so it is important to the manufacturer that the returned devices be properly retested and analyzed to properly assess the cause of the defect in a device. Because of the damage to the leads on these devices, manufacturers of these returned devices are often unable to perform the necessary failure testing and analysis work to verify the failures as being the responsibility of the manufacturer. In addition, other questions about the devices cannot be investigated and answered, questions such as how, where, and why the device failed. Finally, as a result of the damage to the leads of these devices, the most important aspect of failure analysis cannot be performed, that is, determining the root cause of the failure and requesting corrective action from the responsible areas of the manufacturer or customer.

One technique for testing a damaged quad flat pack QFP leads is to manually solder a test-lead wire to a damaged very thin lead to obtain electrical contact with the pin. This is difficult to do with packages having greater than 100 leads. A historically poor success rate for manually soldering a test-lead wire to damaged leads indicates that a better, more efficient technique is needed for retesting returned damaged QFP devices on a manufacturer's automatic testing machines.

Consequently, the need exists for a technique for testing and performing failure analysis of damaged QFP integrated-devices which have been returned by customers to manufacturers as defective parts. Such a technique would significantly reduce the manufacturer's liability for the mistakes of their customers in handling, testing, and/or using QFP integrated-circuit devices.

SUMMARY OF THE INVENTION

It is therefore an object of the invention to provide a technique for testing and performing failure analysis of damaged QFP integrated-devices.

In accordance with these and other objects of the invention, a test socket is provided for mounting and testing a QFP integrated-circuit device, where the QFP has its leads cut or trimmed to extend a predetermined distance from the sidewalls of the QFP integrated-circuit package. The test socket includes a base on which is placed a QFP integrated-circuit device. A plurality of resilient contact blades are mounted to the base and each of the contact blades has a contact point for contacting one of the leads of the integrated-circuit device. A plurality of test connection pins are mounted in the base and are connected to respective ones of the contact blades. The test connection pins are used to engage respective test sockets of an integrated circuit testing machine.

The contacts are resiliently biased into contact with the cutoff leads of a QFP integrated-circuit package. In one embodiment of the invention, the cutoff leads of the QFP integrated circuit package are cut flush to the sidewall of the QFP package. A contact blade includes a resilient stem member having a proximate end fixed to the base of the socket, where the stem member has a head portion at its free, distal end. On the head is fixed a contact for engagement with a corresponding lead of a QFP package. A contact blade includes a resilient extension arm extending from the head portion of the contact blade, wherein the test socket includes movable means for contacting a free end of the extension arm and for applying a force thereto to bias the contact into engagement with a lead of a QFP package.

The test socket includes a comb member mounted to the base wherein the comb member includes electrically insulated means for spacing apart the contact blades mounted to the base. The comb member includes means for adjustably positioning the comb member on the base. The comb member includes surfaces adapted to engage with the respective free ends of the resilient extension arms to bias the contacts into engagement with corresponding leads of a QFP package. The means for adjustably positioning the comb member on the base includes screw adjustment means.

A method is provided according to the invention for preparing and mounting in a test socket a QFP integrated-circuit device having damaged leads. The steps of the invention include trimming each of the leads of a QFP integrated-circuit device to a predetermined length. The device with trimmed leads is then placed in a test socket where the leads of the QFP integrated-circuit are contacted with a resiliently-mounted contact blade extending from the base of the socket to provide electrical connection between the leads of the QFP integrated-circuit device and external pins mounted to the socket.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Figure 1:
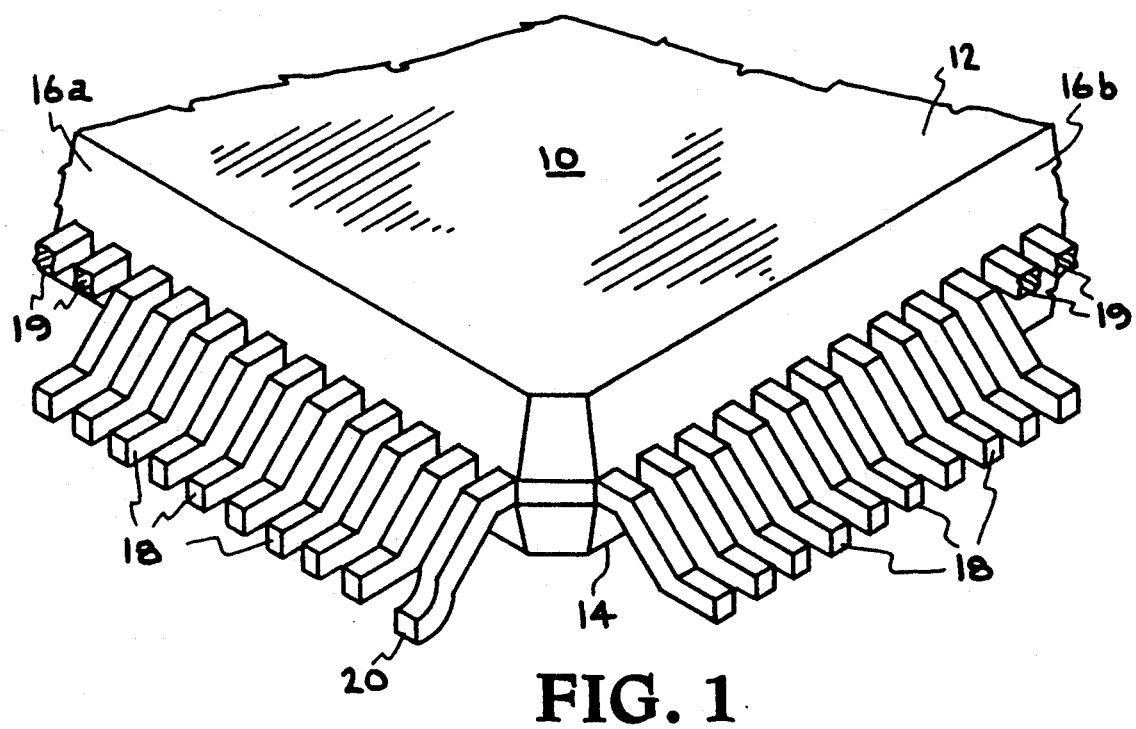
FIG. 1 is a partial view of a quad flat pack QFP integrated circuit package having one of its leads bent.

FIG. 1 shows a portion of a typical quad flat pack QFP integrated circuit package 10, formed of molded epoxy material. The package has flat, horizontal top and bottom surfaces 12, 14 and vertical side walls (typically shown as 16a, 16b). A number of very thin metallic leads 18 extend horizontally outward from the side walls 16a, 16b of the package 10. The midsections of the leads are directed downwardly at an angle, and the free ends of the leads are again directed horizontally outward from the package, as shown in the figure. For assembly and testing, an integrated-circuit package 10 is mounted to a printed circuit board by soldering the free ends of the leads 18 to pads on a printed circuit board.

When a particular QFP integrated-circuit package is suspected by a customer of being defective, the package is removed from the printed circuit by desoldering the leads. Often the leads of the QFP package are damaged during desoldering and/or removal of the device from the printed-circuit board. A lead is often broken off near the sidewall, making it very difficult to for a manufacturer to retest a returned device. Leads 19 represent typical of a QFP package which have been broken off near the sidewalls of the package. A lead 20 near the corner of the package 10 is shown with its free end bent, to represent a displaced lead.

Figure 2:
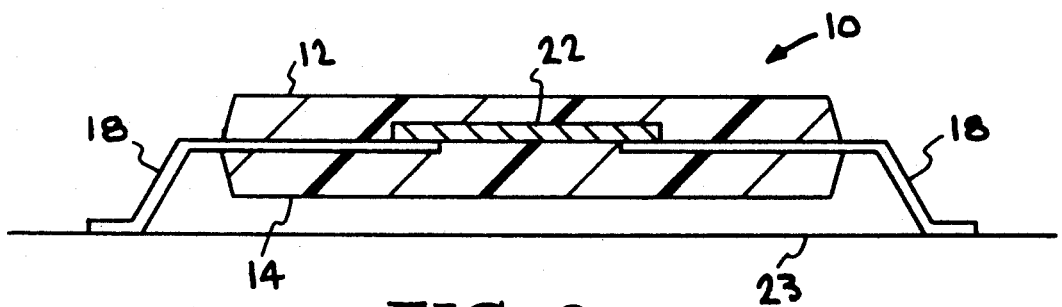
FIG. 2 is a sectional view of a QFP package showing leads extending from an integrated circuit die within the package and terminating in a coplanar seating reference plane.

FIG. 2 is a sectional view of a QFP package 10 showing the leads 18 extending from an integrated circuit die 22 within the package. The leads 18 terminate in a coplanar seating plane, represented by the line 23. Since this type of package is surface mounted to a print circuit board by tack-soldering the end of the leads 18 to pads on the circuit board, a lead end which is not located in the coplanar seating plane 23 may not be properly connected to the printed circuit board. Consequently, the end of a lead must meet a lead coplanarity specification with respect to an arbitrarily defined seating plane for a package, where the seating plane is defined as the plane of the lowest lead ends of a package. The lead 20 shown in FIG. 1 does not meet the coplanarity specification. Because the leads 18 are very thin, they often break during the desoldering step. As mentioned hereinabove, these breaks often occur very near to or flush with the surface of the sidewalls 16a, 16b, making it very difficult to make a connection from the broken lead stub to a testing machine for testing and analysis at the manufacturer's test site.

Figure 3:
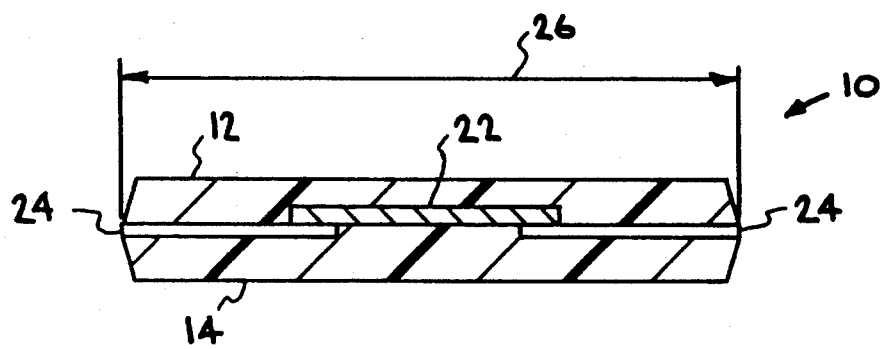
FIG. 3 is a sectional view of a QFP package showing the leads trimmed to a predetermined length flush with the sidewalls of the package.

FIG. 3 is a sectional view of a QFP package showing leads 18 trimmed to a predetermined length, for example, flush with the sidewalls 16a, 16b of the package 10. Note that other trimmed lead lengths can be used. Because a number of leads may be broken near the sidewalls, trimming the leads 18 of the package 10 flush with the sidewalls 16a, 16b provides a standardized lead length. This lead length accommodates testing of all of the leads, even those which have been broken off at the sidewall interface. The leads 18 are trimmed by cutters or by grinding the leads away with an abrasive wheel or the like. The leads are cut, or trimmed, to provide a controlled distance 26 between the cut ends of the leads 18.

Figure 4:
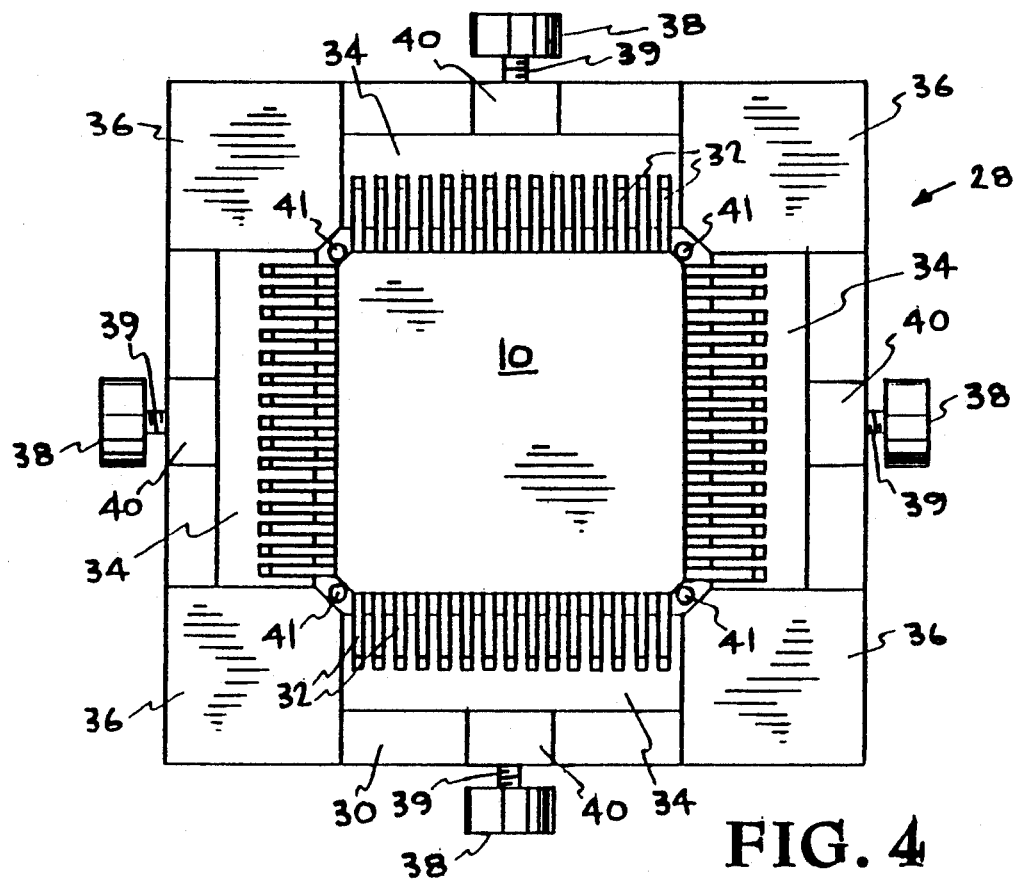
FIG. 4 is a top view of a test socket showing a number of test contact blades provided on a test socket for testing and analyzing a QFP device having its leads trimmed to a predetermined length.

FIG. 4 is a top view of a test socket 28 used in testing and analyzing a QFP device with clipped leads, according to the invention. A test-socket base 30 is a rectangular-shaped plate formed of an electrical insulating material. A number of test contact blades 32 are formed of electrical conducting material. These contact blades 32 are positioned around the periphery of the test socket 28 to make contact with the clipped leads of a QFP package 10 positioned in the center area of the test socket 28.

Located near each of the four sides of the test socket 28 are movable blade combs 34, which are blocks of insulating material having alternating slots and separators formed therein for keeping the contact blades 32 spaced apart from each other. At each of the four corners of the test-socket base 30 are provided fixed guide blocks 36. The guide blocks have side surfaces which engage with corresponding sides surfaces of the movable blade combs 34. Adjustment of the lateral position of each of the movable blade combs 34 is provided by means of an adjustment mechanism, which includes a thumbscrew 38 attached to the end of a shaft 39 with external threads formed therein for engagement with internal threads formed in a mounting block 40 fixed to the center of each side of the base 30. Four positioning pins 41 are located on the base 30 to engage the chamfered corners of a QFP package 10.

Figure 5:
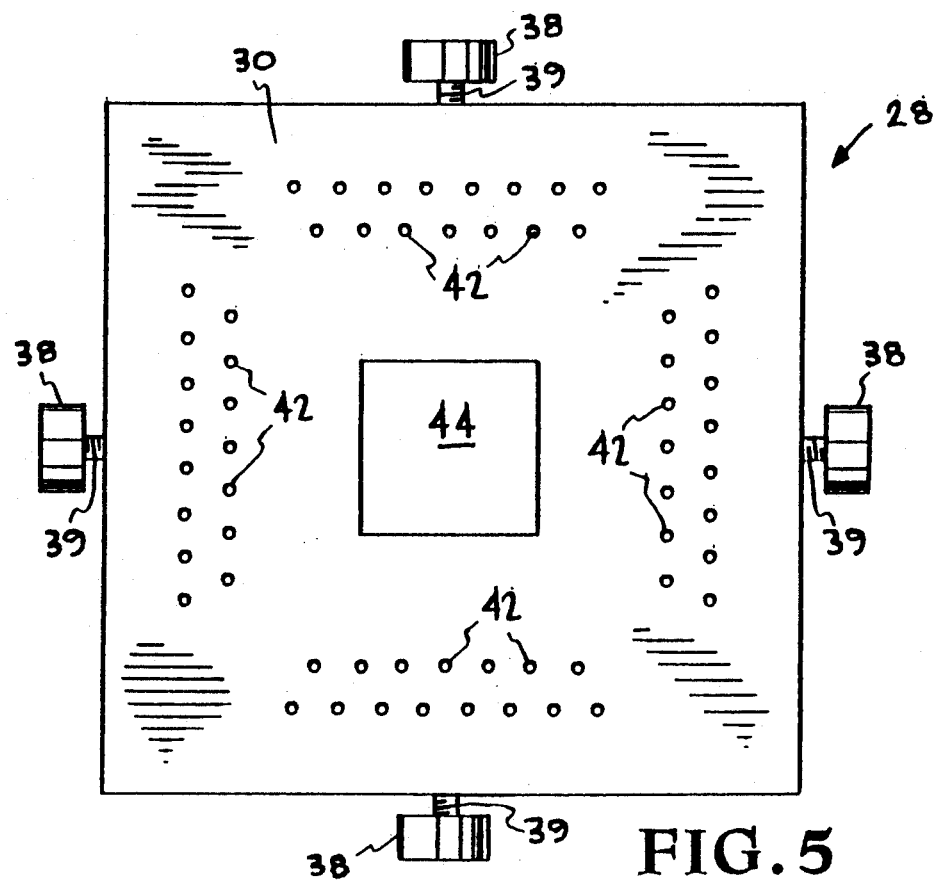
FIG. 5 is a bottom view of the test socket of FIG. 4, showing connection pins extending from the bottom of the test socket.

FIG. 5 is a bottom view of the test socket 28, showing a number of connection pins 42. Each of the contact blades 32 is respectively connected to a connection pin 42 mounted in the base portion 30 of the socket. The connection pins 42 are received in the sockets of a test machine in which the integrated circuit is tested and analyzed.

Figure 6:
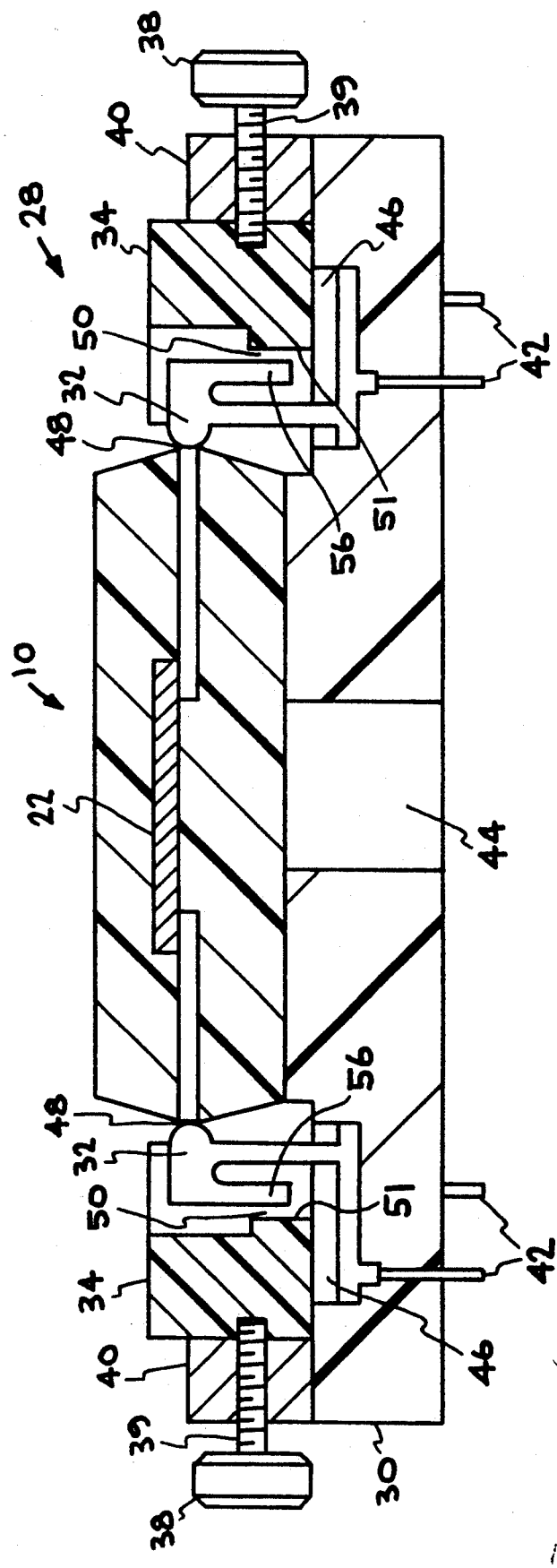
FIG. 6 is a cross-sectional view of a test socket and a QFP package, showing test contact blades engaging the ends of the trimmed leads of the QFP package, where the leads are cut flush to the sides of the package.

FIG. 6 is a cross-sectional view showing a test socket 28 with a QFP package 10 mounted therein. Each of the contact blades 32 is mounted in a slot 46 formed in the base 30. The contact blades 32 are resilient so that the contact blades engage the ends of the clipped leads 24 of an integrated circuit package 10 at contact points 48, provided that the distance 26 (as shown in FIG. 3) between opposite sides of the package is maintained. If the distance 26 is maintained, a clearance gap 50 is provided between each of the contact blades and the inside surface of the movable blade comb 34. However, if the distance 26 between the ends of the cutoff leads is short, the contact blades 32 will not make good contact with the ends of the package leads. It may also be desired that, for purposes of loading or unloading a package into the test socket 28, the contact blades 32 are withdrawn from the package. In either case, the blade comb 34 can be moved toward the package 10 using the thumbscrews 38 so that the gaps 50 between the contact blades and the inside surfaces of the blade combs 34 are closed. This provides for better contact of the contact blades 32 with the leads of the package 10.

Figure 7:
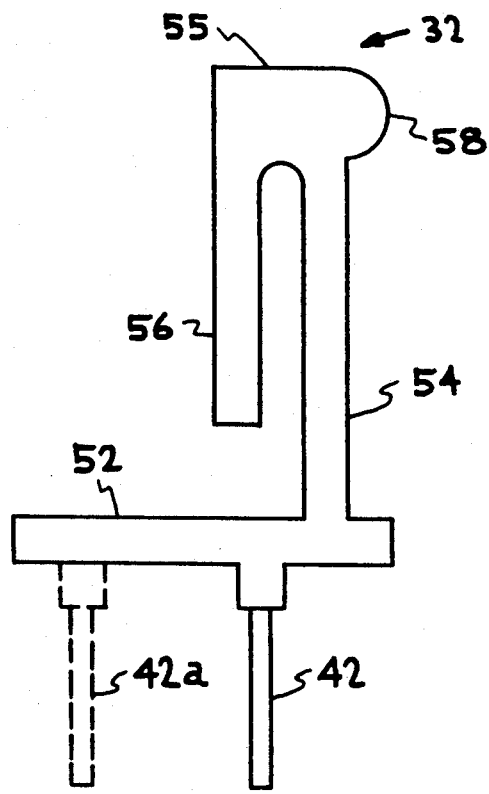
FIG. 7 is a side view of a test contact blade which has a rounded contact nose for engaging the end of a trimmed QFP package lead.

FIG. 7 shows a sideview of a test contact blade 32. A horizontally extending blade base 52 fits within one of the slots 46 formed in the base 30 of the test socket 28. A connection pin 42 extends downwardly from the base 52 of the blade. The connection pins 42 are located to match the pattern of the sockets on a test machine. To accommodate a staggered pattern of sockets in a test machine, alternative connection pins 42a are provided on the base 52 of the contact blade 32, as indicated in the drawing. The contact blade 32 typically has a rectangular cross-sectional profile, while a connection pin 42 typically has a round cross-sectional profile for engagement with a socket of a test machine. An elongated, resilient blade stem 54 extends upwardly from the blade base 52 to a head portion 55 of the blade. Extending downwardly from the head 55 of the blade is an elongated resilient extension arm 56. A rounded nose contact 58 extends from the head of the contact blade to engage the end of a trimmed lead of a QFP package, as indicated in FIG. 6. When the contact 58 does not make adequate contact with the end of a cutoff package lead, the free ends of the extension arms 56 are contacted by the inside surfaces 51 of the comb 34 to bias the heads 55 of the blades 32 into better contact with the cut-off package leads.

Figure 8:
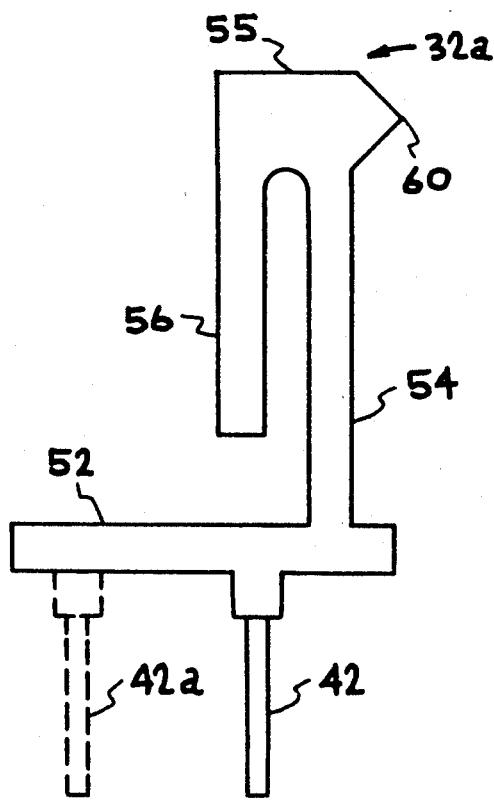
FIG. 8 is a side view of a test contact blade having a pointed contact nose.

FIG. 8 is a side view of a test contact blade 32a having a head 55 with an alternatively pointed contact nose 60 for engagement with the end of a cut-off lead.

Figure 9:
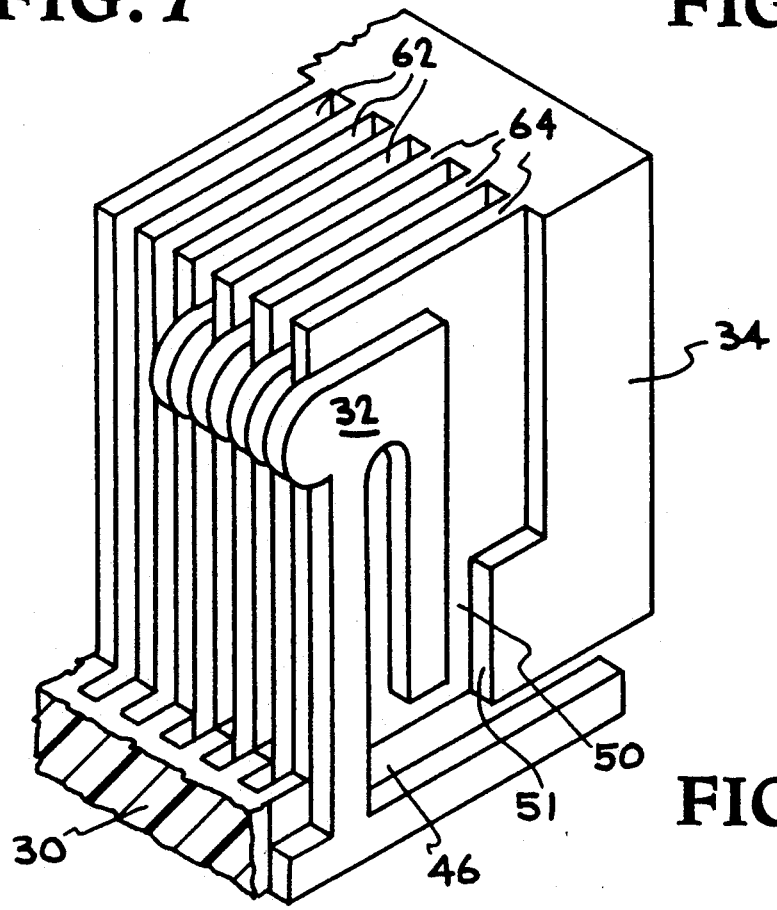
FIG. 9 is a partial view of a number of several contact blades spaced apart by the separator members of an insulated comb member.

FIG. 9 is an enlarged, partial view which shows in greater detail a number of test contact blades 32 fixed within a series of spaced-apart slots 62 formed in the comb 34. The blades 32 are spaced apart from each other by separator panels 64 extending from the comb 34. The gap 50 is provided between the free ends of the extension arms 56 and the inside surfaces 51 of the comb 34.

In operation, the resilient blade stem 54 biases the contacts 58 or 60 into contact with the ends of cut-off package leads. If adequate contact is not made, the free ends of the extension arms 56 are contacted by the inside surfaces 51 of the comb 34 to push against the extension arms. This moves the head 55 of the blade 32 so that the contacts 58 or 60 make better contact with the cutoff package leads. To release a package from the contact blades 32, the thumbscrews are turned to move the combs away from the package 10.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. A test socket into which is mounted for testing a quad flat pack QFP integrated-circuit device having a plurality of leads, which are cutoff flush to the sidewalls of said QFP package, said test socket comprising:
   a base on which is mounted and supported a QFP integrated-circuit device, wherein the QFP integrated-circuit device has leads which are cutoff flush to the sidewalls of the package;
   a plurality of resilient contact blades mounted to said base, each of said contact blades having a contact point for contacting one of the flush cutoff leads of the integrated-circuit device, wherein each of said contact blades includes a resilient stem member having a proximate end fixed to the base of said socket, said stem member having at its free, distal end a head portion, on which is fixed a contact for engagement with a corresponding flush cutoff lead of a QFP package; and
   a plurality of test connection pins mounted in said base and connected to respective ones of said contact blades.

2. The test socket of claim 1 wherein the contact blade includes an additional resilient extension arm extending from the head portion of the contact blade and wherein the test socket includes movable means for contacting a free end of the additional resilient extension arm and for applying a force thereto to bias the contact into engagement with a flush cutoff lead of a QFP package.

3. The test socket of claim 1 including a movable comb member mounted to the base wherein the comb member includes electrically insulated means for spacing part contact blades mounted to the base.

4. The test socket of claim 3 including means, fixed to the base, for adjustably positioning the movable comb member on the base and wherein the movable comb member includes surfaces adapted to engage with the respective free ends of the resilient extension arms to bias the contacts into engagement with corresponding cutoff leads of a QFP package.

5. The test socket of claim 4 wherein the means fixed to the base for adjustably positioning the comb member on the base includes screw adjustment means mounted on said base.

6. A method of preparing and mounting in a test socket a QFP integrated-circuit device having damaged leads, comprising the steps of:
   trimming each of the leads of a QFP integrated-circuit device by cutting the leads substantially flush with the sidewalls of the QFP device;
   placing the QFP integrated-circuit device in a test socket; and
   contacting each of the flush cutoff leads of the QFP integrated-circuit with a respective one of a plurality of resiliently-mounted contact blades extending from said socket to provide electrical contact with external pins mounted to said test socket.

7. The method of claim 6 including the step of separating the contact blades with a movable comb member.

8. The method of claim 7 including the step of adjustably positioning the movable comb member to contact the contact blades and to bias the contact blades into engagement with the respective cutoff ends of the leads of the QFP integrated-circuit device.

9. The method of claim 8 including the step of adjustably positioning the comb member with a screw-adjustment mechanism mounted to said base.

10. The method of claim 8 including the step of contacting an additional extension arm extending from a contact blade with the comb member to bias the contact blade into engagement with a respective flush cutoff lead of a QFP integrated circuit device.

* * * * *